US008513125B2

(12) United States Patent  (10) Patent No.: US 8,513,125 B2
Saracco et al.  (45) Date of Patent: Aug. 20, 2013

(54) MANUFACTURING A MICROELECTRONIC DEVICE COMPRISING SILICON AND GERMANIUM NANOWIRES INTEGRATED ON A SAME SUBSTRATE

(75) Inventors: Emeline Saracco, Grenoble (FR); Jean-Francois Damlencourt, Laval (FR); Michel Heitzmann, Crolles (FR)

(73) Assignee: Commissariat a l'energie atomique et aux alternatives, Paris (FR)

( * ) Notice: Subject to any disclaimer, the term of this patent is extended or adjusted under 35 U.S.C. 154(b) by 253 days.

(21) Appl. No.: 12/871,326

(22) Filed: Aug. 30, 2010

(65) Prior Publication Data

US 2011/0070734 A1  Mar. 24, 2011

(30) Foreign Application Priority Data

Sep. 18, 2009  (FR) ..................... 09 56427

(51) Int. Cl.
*H01L 21/302* (2006.01)
*C03C 15/00* (2006.01)

(52) U.S. Cl.
USPC ............. 438/689; 216/11; 216/13; 216/37; 216/41; 216/46; 216/51; 216/56; 216/58; 216/67; 216/72; 216/83; 216/85; 216/96; 216/99; 438/137; 438/138; 438/142; 438/149; 438/193; 438/195; 438/201; 438/212; 438/270; 438/694; 438/696; 438/703; 438/706; 438/707; 438/710; 257/250; 257/331; 257/347; 257/401

(58) Field of Classification Search
USPC ............. 216/11, 13, 37, 41, 46, 51, 56, 58, 216/67, 72, 83, 95, 96, 99; 438/137, 138, 438/142, 149, 193, 201, 212, 270, 195, 689, 438/694, 696, 703, 706, 707, 710, 719; 257/250, 331, 347, 401

See application file for complete search history.

(56) References Cited

U.S. PATENT DOCUMENTS

| | | | | |
|---|---|---|---|---|
| 6,150,217 A * | 11/2000 | Chang et al. | .................. | 438/255 |
| 6,306,707 B1 * | 10/2001 | Foster et al. | .................. | 438/264 |
| 8,106,464 B2 * | 1/2012 | Cho et al. | ...................... | 257/401 |
| 8,183,104 B2 * | 5/2012 | Hobbs et al. | .................. | 438/199 |
| 8,389,347 B2 * | 3/2013 | Tezuka et al. | ................. | 438/157 |
| 8,389,416 B2 * | 3/2013 | Luong | ........................... | 438/714 |

(Continued)

FOREIGN PATENT DOCUMENTS

FR  2 905 197 A1  2/2008
WO  WO 2008/069765 A1  6/2008

OTHER PUBLICATIONS

Jingyun Huang et al., "Calculation of Critical Layer Thickness Considering thermal Strain in $Si_{1-x}Ge_x/Si$ Strained-Layer Heterostructures", Journal of Applied Physics, vol. 83, Issue 1, Jan. 1, 1998, pp. 171-173.

(Continued)

*Primary Examiner* — Nadine G Norton
*Assistant Examiner* — Christopher Remavege
(74) *Attorney, Agent, or Firm* — Oblon, Spivak, McClelland, Maier & Neustadt, L.L.P.

(57) ABSTRACT

A method for manufacturing a device comprising a structure with nanowires based on a semiconducting material such as Si and another structure with nanowires based on another semiconducting material such as SiGe, and is notably applied to the manufacturing of transistors.

15 Claims, 5 Drawing Sheets

(56) References Cited

U.S. PATENT DOCUMENTS

Figure 1A:
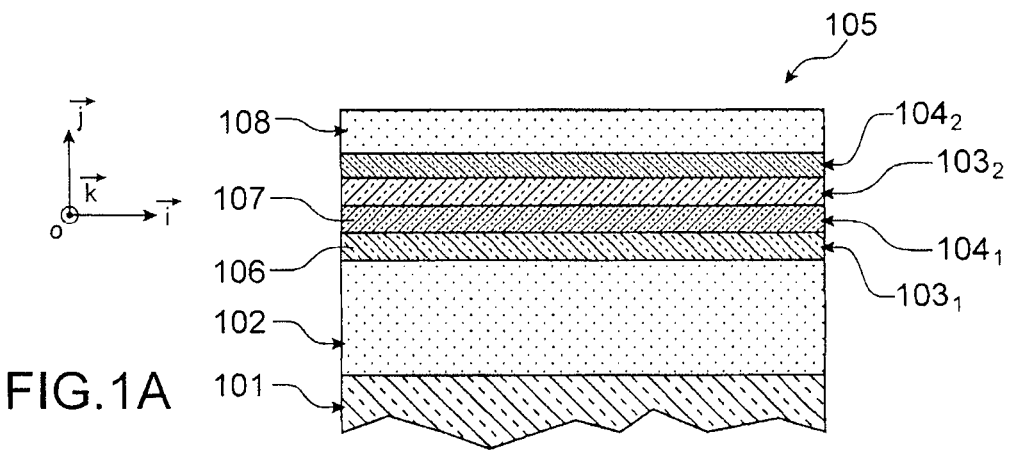

2007/0029586 A1 2/2007 Orlowski
2008/0017934 A1 1/2008 Kim et al.
2008/0050918 A1 2/2008 Damlencourt
2010/0187503 A1* 7/2010 Moriyama et al. .............. 257/24
2011/0049473 A1* 3/2011 Chidambarrao et al. ....... 257/24
2011/0233522 A1* 9/2011 Cohen et al. .................... 257/24

OTHER PUBLICATIONS

P. F. Fazzini et al., "Modelling of the Oxidation of Suspended Silicon Nanowires", MRS Fall Meeting Boston 2008, 6 Pages.

* cited by examiner

MANUFACTURING A MICROELECTRONIC DEVICE COMPRISING SILICON AND GERMANIUM NANOWIRES INTEGRATED ON A SAME SUBSTRATE

TECHNICAL FIELD

The invention relates to the field of microelectronics and microtechnologies and/or nanotechnologies.

The object thereof is to present a microelectronic device provided with semiconducting nanowires based on a semiconducting material and with semiconducting nanowires based on another semiconducting material, on a same substrate.

The present invention also applies to the manufacturing of a device comprising one or more transistors each provided with one or more semiconducting nanowires based on a semiconducting material and further comprising one or more transistors each provided with one or more semiconducting nanowires based on another semiconducting material.

PRIOR ART

The manufacturing of transistors provided with a multichannel structure formed with a plurality of semiconducting nanowires having a critical dimension or a diameter comprised between 5 and 50 nanometers is known.

Devices with transistors provided with both NMOS transistors and PMOS transistors have improved electric performances when the channel structure of the NMOS transistors is based on Si while that of PMOS transistors is based on SiGe.

Moreover the manufacturing of semiconducting nanowires by growth and/or by oxidation of parallelepipedal semiconducting bars is known.

Document FR 2 905 197 as for it discloses a method for manufacturing nanowires based on $Si_yGe_{1-y}$.

The problem is posed of manufacturing a device provided with semiconducting nanowires based on different semiconducting materials on a same substrate.

DISCUSSION OF THE INVENTION

The invention relates to the manufacturing of a microelectronic device comprising, on a same substrate, one or more nanowires based on a given semiconducting material, and one or more nanowires based on another semiconducting material.

It provides the application of a method comprising the steps of:

a) forming on a substrate, at least one first semiconducting block and at least one second semiconducting block distinct from the first block, the first and the second block each comprising one or more bars based on a first semiconducting material and one or more other bars based on a second semiconducting material, said bars and other bars extending along a same direction which is parallel to the substrate, b) removing in said second semiconducting block, the bar(s) based on the second semiconducting material, while the bars of the first block are protected, c) oxidizing the bar(s) based on the first semiconductor and belonging to the second block so as to form one or more nanowires surrounded by a thickness of oxide of the first semiconducting material, while the bars of the first block are protected by an oxidation mask, d) removing the oxidation mask, e) removing the bar(s) based on the first semiconducting material in the first block while the nanowires based on the first semiconducting material are protected, f) oxidizing the bars based on the second semiconducting material so as to form one or more other nanowires.

The second semiconducting material is a material, the oxidation of which is faster than that of the first semiconducting material.

The oxidation or pre-oxidation step c) may thus be carried out on the semiconducting material having the slowest oxidation kinetics.

The method according to the invention may thereby allow formation by oxidation on a same substrate, of nanowires based on different semiconducting materials and having different or even highly different oxidation kinetics.

According to one possibility, the first semiconducting material may be Si, while the second semiconducting material may be $Si_{1-x}Ge_x$.

The first block and the second block may be formed in step a) by etching a stack including an alternation of layers based on the first semiconducting material and of layers based on the second semiconducting material.

Several other blocks may be formed at the same time as the first block and the second block.

According to a possible application, when the second semiconducting material is $Si_{1-x}Ge_x$, the germanium proportion of the second material prior to step f) and the duration of step f) are provided so that, at the end of this step, said other nanowire is based on Ge.

The oxidation in step f) may also lead to the reduction of the nanowire(s) formed in step c).

The oxidation in step f) is a dry oxidation. With such a type of oxidation it may notably be possible to obtain good oxidation selectivity between Si and Ge.

The oxidation step f) may be conducted between 850° C. and 930° C. With such a temperature range it is notably possible, when the second semiconducting material is $Si_{1-x}Ge_x$, to obtain good diffusion of Ge and avoid formation of defects.

The thickness and the respective critical dimension of the bars, as well as the duration of the oxidation in step c) and of the oxidation in step f) may be provided so that, at the end of step f), the nanowire and said other nanowire have equal or substantially equal critical dimensions.

According to a possible application, the first block may be protected upon the removal carried out in step b) by said oxidation mask.

The oxidation mask may for example be based on nitride, for example $Si_3N_4$ or SiN.

According to one possibility, a relaxation layer may be formed between the oxidation mask and said blocks, said relaxation layer being suppressed before step d).

The relaxation layer may be based on $SiO_2$.

The method may further comprise between step a) and step b):

- the formation of an oxidation mask layer on said semiconducting blocks,
- the formation of a protective layer on the oxidation mask layer,
- the removal of said protective layer and of the oxidation mask layer facing the second block, an oxidation mask being retained facing the second block.

The relaxation layer and the protective layer may be formed on the basis of the same material, so that the removal of the protective layer facing the first block may be carried out at the same time as that of the relaxation layer covering the second block.

According to a possible application of the method, the bars may have a square section. This may allow nanowires to be formed with a circular section.

SHORT DESCRIPTION OF THE DRAWINGS

Figure 1B:
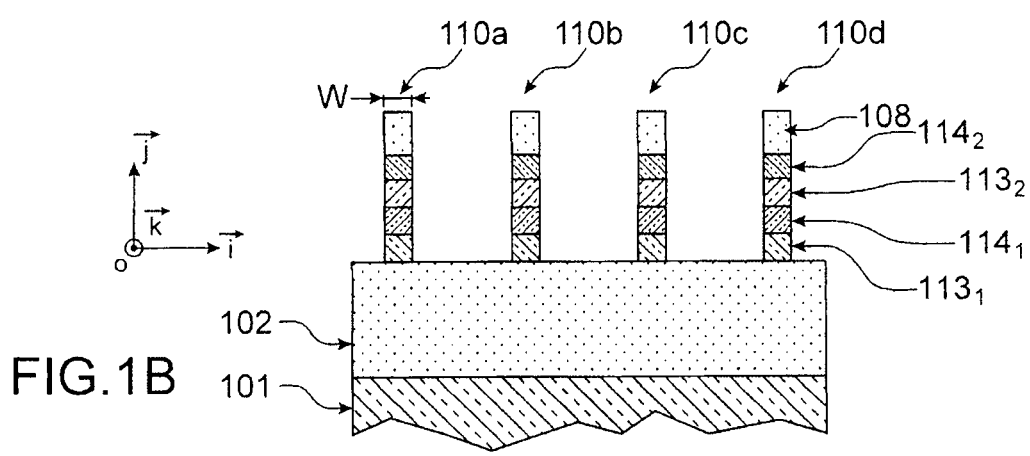
Figure 1C:
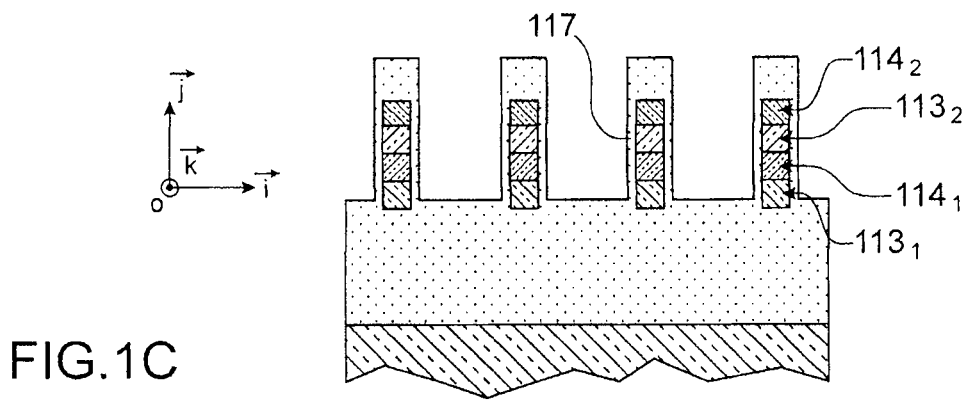
Figure 1D:
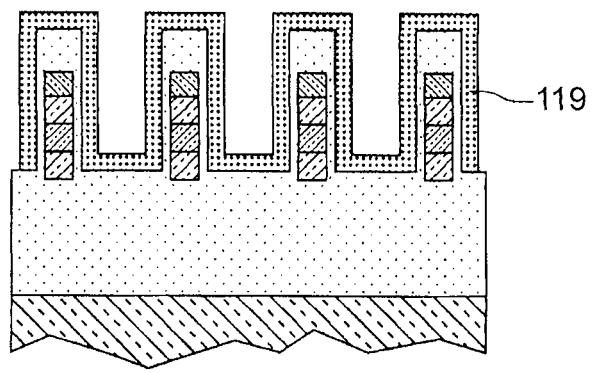
Figure 1E:
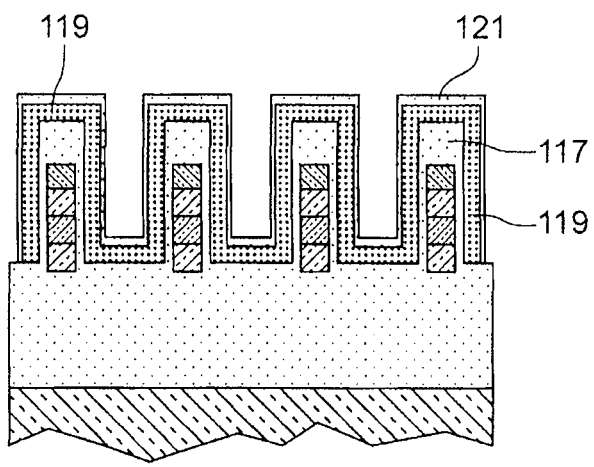
Figure 1F:
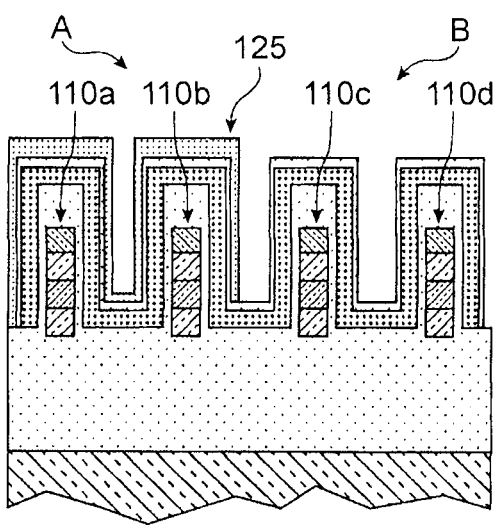
Figure 1G:
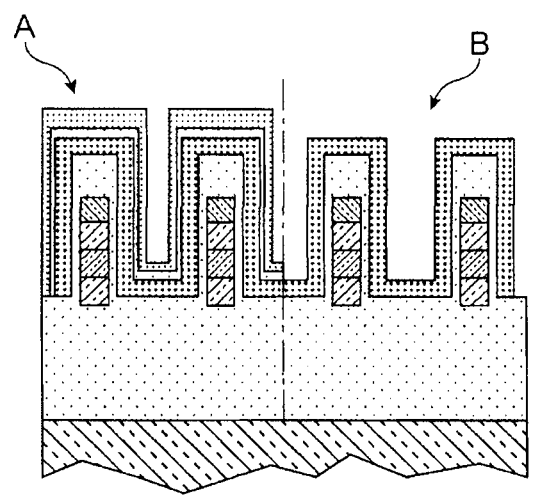
Figure 1H:
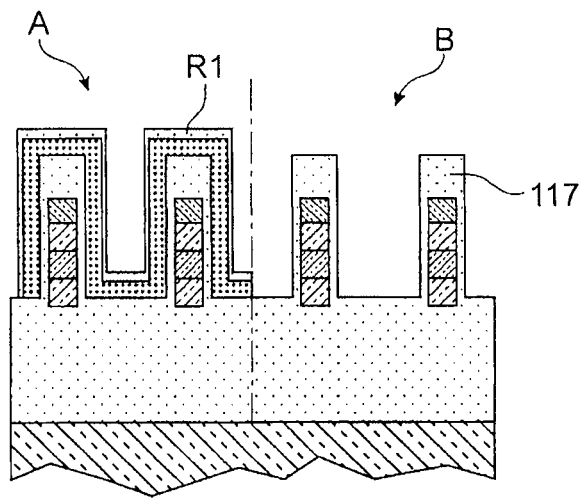
Figure 1I:
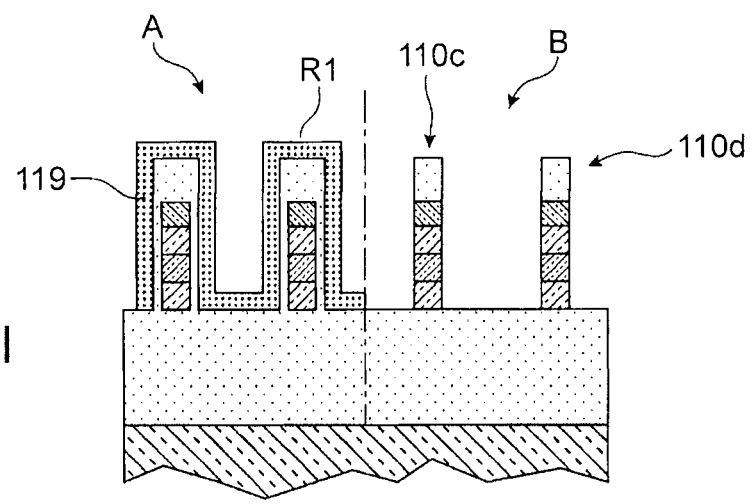
Figure 1J:
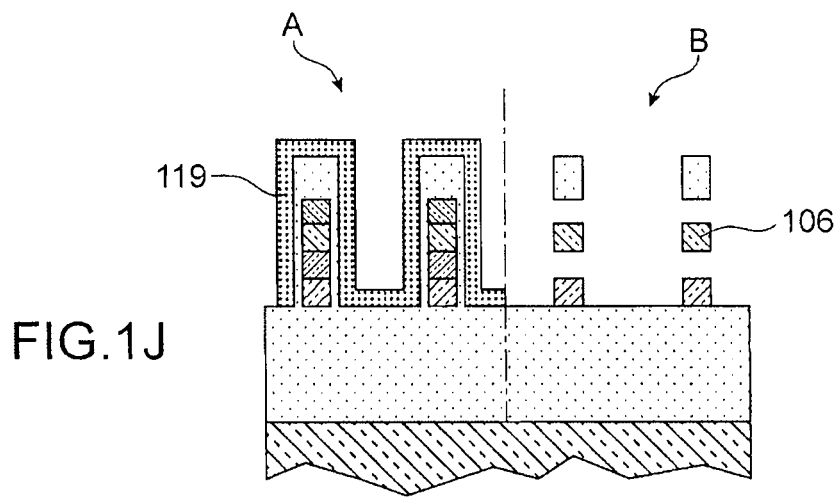
Figure 1K:
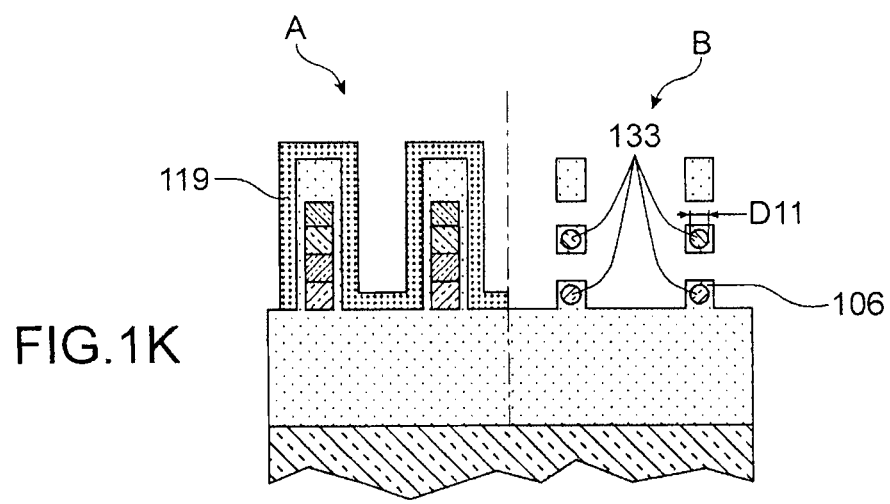
Figure 1L:
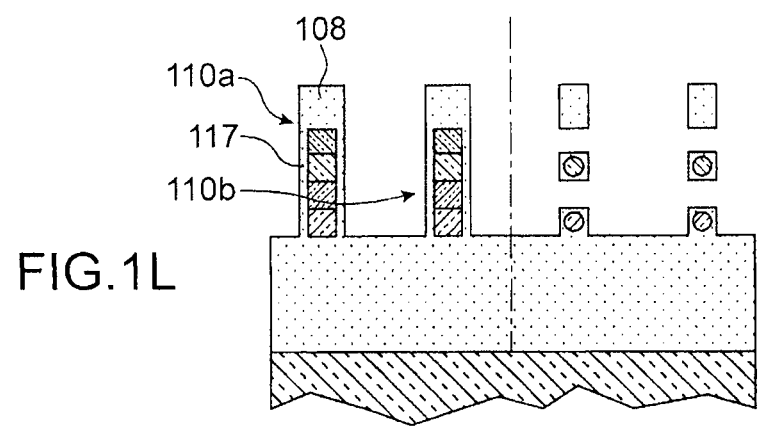
Figure 1M:
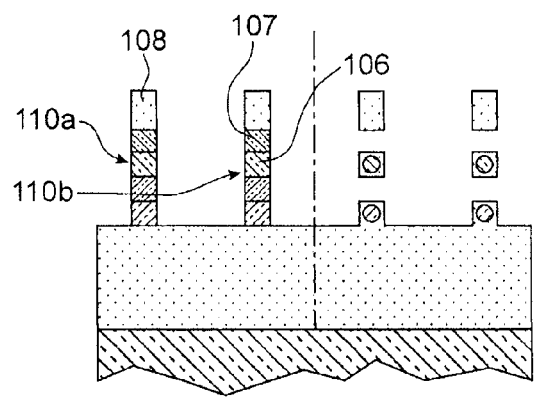
Figure 1N:
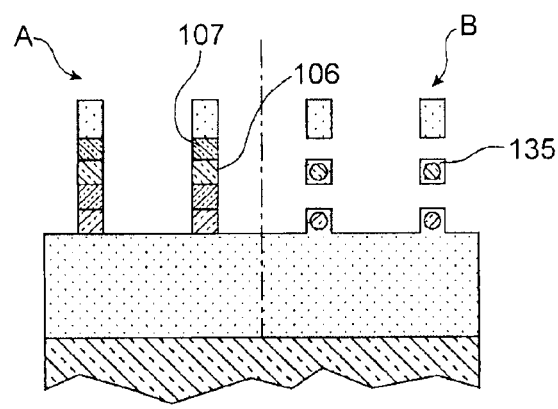
Figure 1O:
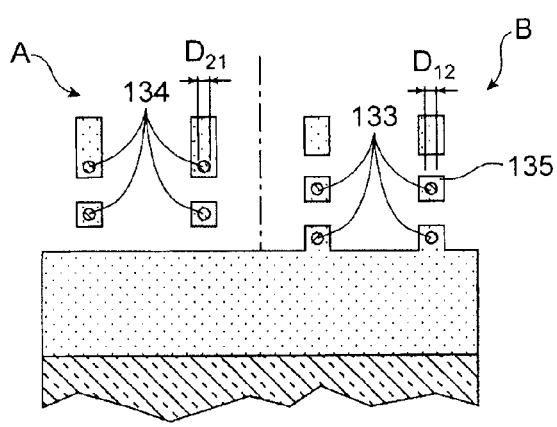
Figure 2:
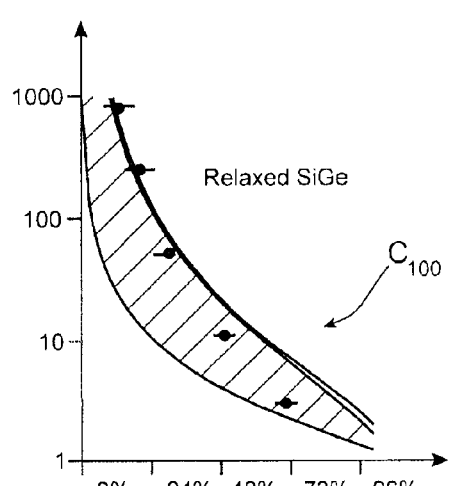

The invention will be better understood upon reading the detailed description which follows of embodiments of the invention, provided as an illustration and by no means as a limitation, with reference to the appended drawings, wherein:

FIGS. 1A-1O illustrate a method according to the invention for manufacturing a microelectronic device provided with nanowires based on a given semiconducting material such as Si, and with nanowires based on another semiconducting material such as $Si_{1-y}Ge_y$, co-integrated on a same substrate, FIG. 2 gives a critical thickness curve of a layer of SiGe versus its Ge concentration.

DETAILED DISCUSSION OF PARTICULAR EMBODIMENTS

An exemplary embodiment of a method for manufacturing a microelectronic device provided with nanowires based on a semiconducting material and with nanowires based on another semiconducting material, co-integrated on a same substrate, will now be given in connection with FIGS. 1A-1O.

The first step of this method illustrated in FIG. 1A may consist of making a stack of thin semiconducting layers on a substrate, which may be of the semiconductor-on-insulator type and comprise a supporting semiconducting layer 101, for example based on silicon, on which lies an insulating layer 102 for example a layer of $SiO_2$-based buried oxide, itself covered with a semiconducting layer $103_1$ with generally a thinner thickness than the supporting layer, and which will be called a thin semiconducting layer $103_1$. In the case when the substrate is an SOI (<<silicon-on-insulator>>) substrate, this thin semiconducting layer $103_1$ may for example be based on silicon.

Several other layers $104_1, 103_2, 104_2$, are made on the thin semiconducting layer $103_1$, and form with the latter a stack 105 of thin semiconducting layers resting on the insulator layer 102.

The semiconducting layers $104_1, 103_2, 104_2$, may for example be formed by several successive epitaxies from the thin semiconducting layer $103_1$.

The stack 105 in this example includes N=4 semiconducting layers $103_1, 104_1, 103_2, 104_2$. The method according to the invention is not limited to such a number of semiconducting layers.

An alternation of layers noted as $103_1, 103_2$, based on a first semiconducting material 106, which, in this example is Si, and of layers noted as $104_1, 104_2$, based on a second semiconducting material 107 which, in this example, is $Si_{1-x}Ge_x$ with (20%<x<30%) is formed.

The layers $103_1, 103_2$, based on Si have respective thicknesses (measured in a direction orthogonal to a main plane of the insulating layer 102, and parallel to the vector $\vec{j}$ of the reference system [o; $\vec{i}$; $\vec{j}$; $\vec{k}$] defined in FIG. 1A) which may for example be comprised between 20 and 40 nanometers.

The thickness of the layers $104_1, 104_2$ based on $Si_{1-x}Ge_x$ may, as for it, be selected to be less than a plastic relaxation thickness, and which may for example be determined from a curve $C_{100}$ such as the one given in FIG. 2 from: *J. Appl. Phys.* 83, 171, (1998), which gives the critical thickness of a $Si_{1-x}Ge_x$ layer versus the Ge concentration. By critical thickness is meant the thickness from which the SiGe deposited on Si is plastically relaxed.

Once the stack 105 is made, deposition of a hard mask layer 108, for example based on $SiO_2$, with a thickness which may for example be of the order of 20 to 50 nanometers, may be carried out.

The hard mask layer 108 may be formed with a silicon oxide of the HTO type (HTO for <<High Thermal Oxide>>).

Next, a photosensitive resin layer (not shown) is deposited, for example based on polyimide, onto the hard mask layer 108, and a resin mask including a plurality or patterns is defined in the resin layer for example by photolithography.

And then, anisotropic etching of the hard mask layer 108 protected by the resin mask (not shown) is carried out in order to reproduce the plurality of patterns of the latter. The resin is then removed (FIG. 1B).

It is then proceeded with a step for etching the layers $103_1, 103_2, 104_1, 104_2$, located under the hard mask 108, in order to reproduce the patterns of the latter in the stack 105. Etching may be achieved for example by dry plasma etching based on $HBr/O_2/Cl$.

In this way several distinct blocks 110a, 110b, 110c, 110d, may be formed, each comprising a plurality of parallelepipedal bars also called beams $113_1, 113_2, 114_1, 114_2$ which are stacked.

In FIG. 1B and the following, these beams are seen in a transverse section in a plane which is parallel to the plane [o; $\vec{i}$; $\vec{j}$] defined in FIGS. 1A and 1B. Moreover the same applies to the nanowires which will be the subject later on.

The beams (like these nanowires) extend along a same direction which is parallel to the substrate. In the example, the same direction is parallel to the main plane of the insulating layer 102 and it is defined by the vector $\vec{k}$ of FIGS. 1A and 1B.

The beams $113_1, 113_2, 114_1, 114_2$ may have a critical dimension W (measured in a plane parallel to the main plane of the insulating layer 102) i.e. parallel to the plane [o; $\vec{i}$; $\vec{k}$] plane defined on FIG. 1B) comprised between 20 nm and 50 nm. The critical dimension may be defined as the smallest dimension of the beams except for their thickness.

This critical dimension W as well as the thickness e (measured in a direction orthogonal to the main plane of the insulating layer 102, and parallel to the vector $\vec{j}$ of the reference system [o; $\vec{i}$; $\vec{j}$; $\vec{k}$] defined in FIG. 1B) of the beams of $Si_{1-x}Ge_x$ and of Si, partly define the final size of the nanowires intended to be made. In order to obtain nanowires of circular section, provision may be made for making beams $113_1, 113_2, 114_1, 114_2$ with a square section, the form factor of which between their width W and their thickness is equal or substantially equal to 1.

The final size which a nanowire will have may be provided so as to obtain a compromise between good electrostatic control of the nanowire and good mechanical strength.

A layer 117 is then formed, which may be insulating and which covers the flanks of the blocks 110a, 110b, 110c, 110d, for example based on $SiO_2$ (FIG. 1C).

And another layer 119 is then formed on the first insulating layer 117. The other layer 119 may be provided in order to form an oxidation mask and to give the possibility of preventing or delaying oxidation of a material which it covers. The oxidation mask layer 119 may be insulating and be for example based on $Si_3N_4$ or SiN.

The oxidation mask layer 119 may have a thickness comprised for example between 5 and 10 nanometers thick (FIG. 1D).

And a third layer 121 is then made covering the flanks of the blocks 110a, 110b, 110c, 110d. The third layer 121 may act as a layer for protecting the oxidation mask layer. The protective layer 121 may be based on a material capable of being selectively etched with regard to that of the layer 119 and on the same material as the layer 117. The protective layer 121 may for example be based on $SiO_2$.

The layer 117 based on $SiO_2$ may be a so-alled <<relaxation>> layer, provided for reducing the stress exerted by the oxidation mask layer 119 with regard to the blocks 110a, 110b, 110c, 110d, in particular when this layer 119 is based on $Si_3N_4$ (FIG. 1E).

Several areas of the substrate are then defined in which will be made nanowires based on a given semiconducting material and nanowires based on another semiconducting material, respectively, for example a first area A in which nanowires based on Si are intended to be formed, and a second area B for example in which nanowires based on $Si_xGe_{1-x}$ or Ge are intended to be made.

Next, a resin mask 125 is formed in the first area A, facing some of the blocks 110a, 110b, among the set of etched blocks of the stack 105, the second area B, and in particular the other blocks 110c, 110d, as for them, not being covered by the mask 125 (FIG. 1F).

The protective layer 121 in the second area B facing the blocks 110c, 110d is then removed for example by means of anisotropic dry plasma etching on the basis of fluorocarbon chemistry (for example: $C_4F_8$/CO/Ar) in a RIE (Reactive Ion Etching) or ME-RIE (Magnetically Enhanced Reactive Ion Etching) piece of equipment equipped with a DFA system, or by means of isotropic wet etching based on HF (FIG. 1G).

And, the resin mask 125 covering the first area A is then removed.

The oxidation mask layer 119 located facing the blocks 110c, 110d in the second area B, may then be selectively etched, with regard to the protective layer 121 located facing the blocks 110a, 110b in the first area A (FIG. 1H). This selective etching may be wet etching on the basis of $H_3PO_4$ or anisotropic dry plasma etching on the basis of fluoro-carbon chemistry (for example: $C_4F_8$/CO/Ar) accomplished in a RIE or ME-RIE piece of equipment for example when the oxidation mask layer 119 and the protective layer 121 are based on $Si_3N_4$ and based on $SiO_2$ respectively.

In the first area A, the protective layer 121 covers the oxidation mask layer 119, while in the second area B, the relaxation layer 117 is exposed.

Removal of a portion of the relaxation layer 117 which is exposed and located in the second area B and of a portion of the protective layer 121 which is exposed and located in the first area A, is then carried out.

When the relaxation layer 117 and the protective layer 121 are based on the same material, for example on $SiO_2$, this removal may be carried out at the same time, for example by means of dry plasma etching on the basis of $C_4F_8$, of CO and of Ar or wet etching on the basis of HF.

At the end of this removal, the oxidation mask layer 119 is exposed in the first area A, while the stacks of semiconducting beams of the blocks 110c, 110d, are exposed (FIG. 1I).

The beams based on the second semiconducting material 107 in the second area B are then removed, while the beams based on the second semiconducting material 107 in the first area A are protected from this removal method by the oxidation mask layer 119.

The removal may be for example carried out by selective etching of $Si_{1-x}Ge_x$ with regard to Si, for example by means of isotropic dry chemical etching with a delocalized plasma based on fluorinated gas ($CF_4$ or $NF_3$), or by wet etching based on HF, acetic acid $CH_3COOH$ and/or $HNO_3$ or high temperature etching on the basis of HCl. At the end of this removal, the beams based on the first semiconducting material 106 have been released in the second area B (FIG. 1J).

A first step for oxidizing the first semiconducting material 106 is then carried out in the second area B, while the semiconducting beams in the first area A are protected by the oxidation mask layer 119. This first oxidation step also called a <<pre-oxidation>> may be carried out for example by means of wet oxidation in order to limit the heat balance.

The oxidation step has the effect of rounding the beams so as to form nanowires 133 with an ovoid or circular section based on the first semiconducting material 106. The nanowires 133 may have a critical dimension D11 or a diameter D11 which may for example be comprised between 20 and 40 nanometers (the critical dimension D11 being indicated in FIG. 1K), and these nanowires are surrounded by a thickness 135 of silicon oxide, for example comprised between 15 and 25 nanometers. During this oxidation, the oxidation mask layer 119 gives the possibility of preventing or delaying possible oxidation of the semiconducting beams located in the first area A.

The thickness 135 of oxide provided around the nanobeams may be adjusted depending on the duration of the oxidation step. This thickness may be provided depending on the thickness of the relaxation layer 117, so that the thickness of the relaxation layer 117 is lower than that of the oxide surrounding the nanowires 133. The oxidation mask layer 119, based on $Si_3N_4$, is then removed. Following this removal, the blocks 110a, 110b, are covered on the top by the mask 108 and on the flanks by the relaxation layer 117 (FIG. 1L).

Removal of the relaxation layer 117 is then carried out. In the case when this relaxation layer 117 is based on $SiO_2$, this removal may be carried out for example with dry plasma etching based on $C_4F_8$, CO and Ar or with wet etching based on HF, and be accompanied by a portion of the thickness of oxide formed around the nanowires 133.

By removing the relaxation layer 117, it is possible to expose the flanks of the blocks 110a, 110b located in the first area A and each formed with stacks of semiconducting beams based on the first semiconducting material 106 and based on the second semiconducting material 107 (FIG. 1M).

In the first area A, removal of the beams based on the first semiconducting material 106 is then carried out while retaining the second semiconducting material 107.

Selective removal of Si with regard to $Si_{1-x}Ge_x$ may be carried out for example by isotropic dry chemical etching with a delocalized plasma based on fluorinated gas for example based on $CF_4/O_2/N_2$, or $NF_3/O_2/N_2$, or $NF_3/O_2$.

The thickness 135 of oxide located around the nanowires 133 in the second area B may as for it be used as a protection during this removal (FIG. 1N).

Oxidation is then carried out, which may be accomplished for example by dry oxidation of the nanobeams at a temperature comprised between 850° C. and 930° C. in order to allow sufficient diffusion of the Ge atoms in the wire while being at a lower temperature than that for melting Ge (FIG. 1O).

The $Si_{1-x}Ge_x$ beams are oxidized for a duration which is selected depending on the desired final critical dimension for the nanowires 133, 134 which one wishes to obtain.

The oxidation of the $Si_{1-x}Ge_x$ beams tends to increase the germanium proportion in the remaining semiconducting material of the beams based on $Si_{1-x}Ge_x$. The final desired proportion of germanium at the end of this step depends on the starting proportion, and on the duration of this oxidation. The oxidation step has the effect of rounding the beams based on $Si_{1-x}Ge_x$ so as to form nanowires 134, based on $Si_{1-y}Ge_y$, with y>x.

During the oxidation of $Si_{1-x}Ge_x$, the Ge concentration in the wire increases while the diameter of the wire decreases. The final Ge concentration and the size of the wire depend on the oxidation time, on the initial size of the beam and on its Ge concentration. The kinetics of oxidation of SiGe nanowires may be of the order of five times faster than that of SiGe layers made full-plate.

For example, with a beam of $Si_{1-x}Ge_x$ of square section with a critical dimension of 22 nm and with an initial Ge concentration of 30%, it is possible to obtain after 14 min of dry oxidation at 900° C., a Ge nanowire of circular section with a critical dimension of 12 nm.

After oxidation, nanowires 134 based on $Si_{1-y}Ge_y$ having a critical dimension D21 or a diameter D21 for example comprised between 5 and 20 nm (the critical dimension D21 being indicated in FIG. 1O), and which are surrounded by a thickness of silicon oxide, for example comprised between 15 and 25 nm, may be obtained.

This oxidation may also have the effect of further reducing the diameter or critical dimension of the nanowires 133 based on Si, the latter may reach a critical dimension D12 or a diameter D12 which may be comprised for example between 5 and 20 nm (the critical dimension D12 being indicated in FIG. 1O).

In order to guarantee the selectivity of the oxidation of Si with regard to Ge, dry oxidation may be carried out.

The oxidation temperature may also be selected so as to be lower than the melting temperature of Ge and sufficiently high for allowing diffusion of Ge in the nanowires 134.

An oxidation temperature Tox comprised between 850° C. and 930° C. may for example be applied in order to guarantee selectivity of the oxidation.

The oxidation duration may be selected so that the nanowires of Si and of $Si_{1-x}Ge_x$ have the same size or critical dimension.

By knowing the initial size of SiGe nanobeam and its Ge concentration, it is possible to calculate the oxidation time $t_2$ required for obtaining a SiGe nanowire with a desired size and Ge concentration.

From this oxidation time, it is possible to calculate for example by using data from the publication: *Modeling of the oxidation of suspended Silicon Nanowire*, P. F. Fazzini, C. Bonafos, A. Hubert, J.-P. Colonna, T. Ernst, M. Respaud, MRS Fall Meeting Boston, 2008, the oxidation time t1 required to be added for obtaining Si nanowires of the same size as those of SiGe while taking into account the additional oxidation time $t_2$, all this at a given temperature and in a given (dry or wet) oxidation method.

In one case for example, where it is desired to obtain nanowires of Ge with a critical dimension of 12 nm, obtained after 14 min of dry oxidation at 900° C., in order to form Si nanowires of the same size, an oxidation of the Si nanowires for a duration of the order of 1 h 20 min for example of dry oxidation at 900° C. may be applied.

During the oxidation, the germanium concentration in the nanowires 134 increases. It is possible to obtain nanowires with a germanium proportion of the order of 100%, so that nanowires 134 based on germanium may be obtained.

An initial Ge concentration x in $Si_{1-x}Ge_x$ in the nanowires comprised between 10 and 40% may be sufficient for obtaining Ge wires after oxidation for a duration comprised for example between 10 and 20 minutes depending on the initial size of the nanowire, which may be comprised between 20 and 50 nm of critical dimension.

For example, if one has an initial nanobeam of square section with a critical dimension of 22 nm and with an initial Ge concentration of 30%, a nanowire with a round section of 12 nm in pure Ge is obtained after 14 min of dry oxidation at 900° C.

For example, $Si_{1-x}Ge_x$ layers 104$_1$, 104$_2$ may have been formed from SiGe, the Ge concentration of which is initially comprised between 10 and 40% for making nanowires based on Ge, advantageously greater than 30% in order to limit the generation of defects in the nanowires.

The invention claimed is:

1. A method for manufacturing a microelectronic device comprising on a same substrate, one or more nanowires based on a given semiconducting material and one or more nanowires based on another semiconducting material, the method comprising the steps of:
   a) forming on a substrate at least one first semiconducting block and at least one distinct second semiconducting block, said first block and said second block each comprising one or more bars based on a first semiconducting material and one or more other bars based on a second semiconducting material, said bars and other bars extending along a same direction which is parallel to said substrate;
   b) removing in said second semiconducting block, the one or more other bars based on said second semiconducting material, while the one or more bars and other bars of said first block are protected;
   c) oxidizing of the one or more bars based on said first semiconductor and belonging to said second block so as to form one or more nanowires surrounded by an oxide of the first semiconducting material, while the one or more bars and other bars of said first block are protected by an oxidation mask;
   d) removing said oxidation mask;
   e) removing the one or more bars based on said first semiconducting material in said first block while said nanowires based on said first semiconducting material are protected; and
   f) oxidizing the bars based on said second semiconducting material so as to form one or more other nanowires.

2. The method according to claim 1, the first block and the second block being formed in step a) by etching of a stack including an alternation of layers based on the first semiconducting material and of layers based on the second semiconducting material.

3. The method according to claim 1, the first semiconducting material being Si, the second semiconducting material being $Si_{1-x}Ge_x$, at the end of step e), said other nanowire being based on $Si_{1-y}Ge_y$.

4. The method according to claim 3, wherein the duration of step f) is provided so that at the end of this step, said other nanowire is based on Ge.

5. The method according to claim 1, the oxidation in step f) leading to the reduction of the nanowire(s) formed in step c).

6. The method according to claim 1, wherein the oxidation in step f) is dry oxidation.

7. The method according to claim 6, wherein the oxidation is conducted between 850° C. and 930° C.

8. The method according to claim 1, wherein the thickness and the respective critical dimension of the bars, as well as the duration of the oxidation in step c) and of the oxidation in step f) are provided so that at the end of step f), the nanowire and said other nanowire have equal or substantially equal critical dimensions.

9. The method according to claim 1, the first block being protected during the removal carried out in step b) with said oxidation mask.

10. The method according to claim 1, the oxidation mask being based on $Si_3N_4$.

11. The method according to claim 10, a relaxation layer being formed between the oxidation mask and said blocks, said relaxation layer being removed before step d).

12. The method according to claim 11, the relaxation layer being based on $SiO_2$.

13. The method according to claim 1, comprising between step a) and step b):
   the formation of an oxidation mask layer on said blocks,
   the formation of a protective layer on the oxidation mask layer, and
   the removal of said protective layer and of the oxidation mask layer facing said second block, an oxidation mask being retained facing said first block.

14. The method according to claim 13, wherein a relaxation layer is formed between said oxidation mask and said blocks, the relaxation layer and the protective layer being formed based on the same material, the removal of the protective layer facing the first block being accomplished at the same time as that of the relaxation layer covering the second block, said relaxation layer being removed before step d).

15. The method according to claim 1, wherein the bars having a square section.

* * * * *

UNITED STATES PATENT AND TRADEMARK OFFICE
CERTIFICATE OF CORRECTION

PATENT NO. : 8,513,125 B2
APPLICATION NO. : 12/871326
DATED : August 20, 2013
INVENTOR(S) : Saracco et al.

Page 1 of 1

It is certified that error appears in the above-identified patent and that said Letters Patent is hereby corrected as shown below:

On the title page, Item [73] should read:

--[73] Assignee: Commissariat a l'energie atomique et aux energies alternatives, Paris (FR)--

Signed and Sealed this
Fifteenth Day of October, 2013

Teresa Stanek Rea
*Deputy Director of the United States Patent and Trademark Office*